United States Patent [19]

Watanuki

[11] Patent Number: 5,037,722

[45] Date of Patent: Aug. 6, 1991

[54] PHOTORESIST EXPOSURE METHOD AND APPARATUS THEREFOR

[75] Inventor: Minoru Watanuki, Tokyo, Japan

[73] Assignee: ORC Manufacturing Co., Ltd., Tokyo, Japan

[21] Appl. No.: 446,610

[22] Filed: Dec. 6, 1989

[30] Foreign Application Priority Data

Mar. 29, 1989 [JP] Japan .................................. 1-77095

[51] Int. Cl.⁵ .......................... G03C 5/00; G03C 5/04
[52] U.S. Cl. .................................... 430/319; 430/311; 430/394; 430/397
[58] Field of Search ................ 430/311, 319, 394, 397

[56] References Cited

U.S. PATENT DOCUMENTS 4,883,571 11/1989 Kondo et al. .................... 204/180.6

Primary Examiner—Charles L. Bowers, Jr.
Assistant Examiner—Ashley I. Pezzner
Attorney, Agent, or Firm—Cushman, Darby & Cushman

[57] ABSTRACT

A photoresist exposure method in which a photoresist that is coated by electrodeposition on the surface of a printed circuit board having been subjected to through-hole plating and on the inner wall surfaces of through-holes therein is exposed to light through a film, comprises the first step of exposing the resist electro-deposited on the inner wall surfaces of the through-hole with a light source positioned adjacent to the board and rotated horizontally along the board surface, and the second step of exposing the resist on the board through a film for forming a precise pattern with a light source positioned remote from the board surface.

1 Claim, 6 Drawing Sheets

FIG.6A
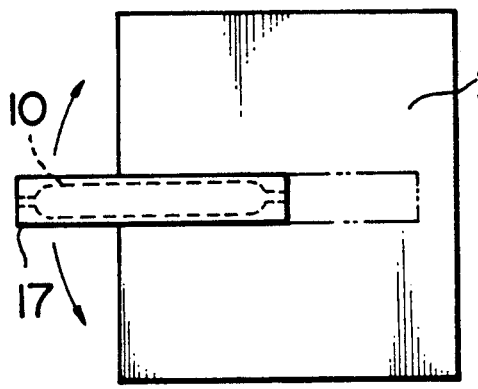
FIG.6B
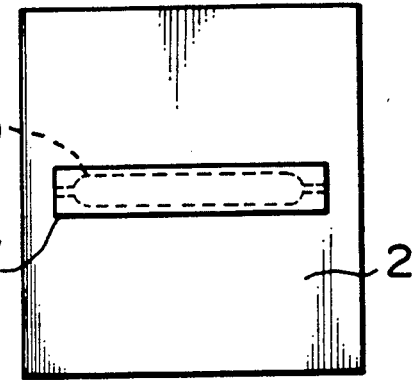
FIG.7A
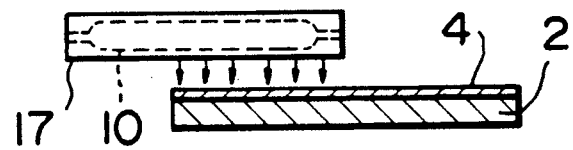
FIG.7B
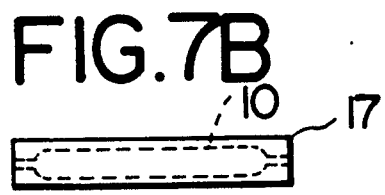
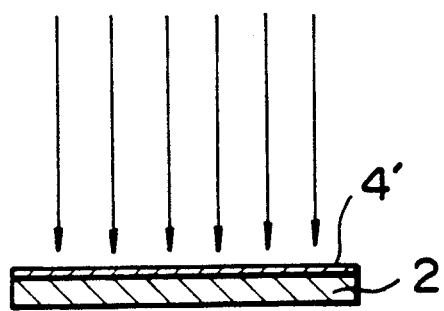

PHOTORESIST EXPOSURE METHOD AND APPARATUS THEREFOR

BACKGROUND OF THE INVENTION

1. Field of the Invention

The present invention relates to a photoresist exposure method. In particular, the invention involves a method which a photosensitive resin (electrodepositional photoresist) coated on the surface of a board for printed wiring and on the inner wall surfaces of through-holes therein by an electrodeposition process is exposed to light through a film.

2. Description of the Related Art

A method of producing a printed-wiring board may be divided into two types, that is, the subtractive method and the additive method. The latter additive method, in which a conductive circuit pattern is formed directly on only a necessary portion of an insulating base by electrolysis plating, needs a high level of technique and process control for maintaining the physical properties of the film formed by electrolysis plating and is therefore not widespread. The former subtractive method, in which a copper-clad laminate is etched to remove the copper therefrom except for the copper pattern defined as the circuit pattern, is presently the leading method for forming a precise circuit pattern.

In the subtractive method, a photosensitive resist film is not hot-laminated on the surface of a copper-clad laminate having been subjected to through-hole plating. Further, and after the resist film is exposed to ultraviolet rays through a negative film, the negative film is removed, and then development is carried out to remove the non-exposed portions of the resist film. Since no conventional photosensitive resist can coat the inner wall surface of the through-holes, there has heretofore been a need for a means for protecting the through-hole plating conductor from the developer and the etching liquid. Examples of such protecting means include the method (tenting method) wherein the copper-clad laminate is directly etched with the through-holes being covered with a dry film or a resist ink, and the method (solder through-hole method) wherein solder is plated over both the conductive circuit pattern and the through-hole plating conductor to form a solder layer which is used as an acid resistant film during the etching process.

However, employment of the polymer electrodeposition method developed recently enables the resist to be coated even on the inner wall surface of the through-holes and hence permits etching to be carried out with the through-holes being covered with the electro-deposit resist after development. According to the polymer electrodeposition, a printed circuit board which has been subjected to through-hole plating is coated by electrodeposition with a photosensitive resin (electro-deposition photoresist) having two functions, that is, electrodepositional and photosensitive functions. Since there is no need for tenting, the polymer electrodeposition has attracted attention as being a method which enables formation of a resist pattern with high resolution.

In the polymer electrodeposition method described above the photoresist, that is uniformly electro-deposited on the surface of the printed circuit board subjected to through-hole plating and on the inner wall surface of the through-holes therein, is exposed to ultraviolet rays through a film by an exposure apparatus. Since there is a large difference in the amount of irradiation energy required between the exposure of the resist for forming a circuit pattern on the surface of the printed circuit board and the exposure of the resist on the inner wall surface of the through-holes, it has heretofore been impossible to use a single exposure apparatus for the two exposure processes. The reasons for this will be explained below in detail. The electro-deposited photoresist is formed with a uniform coating thickness over the board surface and the through-hole inner wall surfaces, but the through-holes vertically extend through the board from the surface thereof and therefore have a depth (the length of the resist layer corresponding to the thickness, or depth, of the through-holes is about 80 times the thickness of the resist coating on the board surface). Further, the through-hole diameter is small, i.e., 0.25 to 0.80 mm, so that light cannot readily enter the through-holes. In addition, the number of through-holes is large, i.e., 5,000 to 13,000 per board. For these reasons, the exposure of the resist on the inner wall surfaces of the through-holes requires a larger amount of irradiation energy than that needed for the exposure of the resist for forming a circuit pattern on the surface. Accordingly, for an adequate amount of irradiation energy applied to the surface of the board, the resist on the inner wall surfaces of the through-holes is left uncured due to a shortage of irradiation needed for the through-holes energy. If the capacity of the light source is increased and the exposure energy is extremely increased in order to sufficiently expose the resist on the through-hole inner wall surface, there will be an adverse effect on the formation of a precise circuit pattern on the surface of the board. More specifically, if the quantity of light is excessively large, the following problems arise: the light undesirably penetrates to the positive portions of the film; expansion and contraction of the film occurs due to the heat from the light; the resist may be destroyed; and the line width of the circuit pattern becomes think or thin, which makes it difficult to form a precise pattern.

Accordingly, it has heretofore been necessary to provide two light sources, that is a light source for exposure of the resist for forming a circuit pattern on the broad surface and a light source for exposure of the resist on the inner wall surfaces of the through-holes, and to carry out exposure with rays of light with a given amount of irradiation energy from each light source disposed at a given distance. Thus, the prior art process is inefficient and inferior in the precision of the resulting circuit pattern.

SUMMARY OF THE INVENTION

In view of the above-described disadvantages of the prior art, it is an object of the present invention to provide a method of exposing a photoresist coated on a printed circuit board wiring by electrodeposition, which enables the resist on the inner wall surfaces of the through-holes in the board and the resist on the board surface to be efficiently exposed by a single exposure apparatus.

It is another object of the present invention to provide an apparatus suitably employed to carry out the photoresist exposure method described above.

To attain the object, the present invention provides a photoresist exposure method in which a photoresist that is coated by electrodeposition on the surface of the board and on the inner wall of the through-holes is exposed with ultraviolet light through a film. The inner wall surface of the through-holes is irradiated through a negative film with a light source positioned adjacent to the workpiece while being rotated. The surface of the workpiece is irradiated through a negative film for forming a precise circuit pattern with a light source positioned separated from the workpiece.

To attain the second object, a photoresist exposure apparatus operates in accordance with the aforementioned, method. The apparatus comprises: a workpiece, a light source facing adjacent to the workpiece, means for separating and approaching the light source vertically with respect to the workpiece surface, and means for rotating the light source horizontally with respect to the workpiece surface.

By virtue of the aforementioned means, the resist electro-deposited on the inner wall surfaces of the through-holes in the printed circuit board is exposed to the strong light source applied from a position adjacent to the workpiece, and the resist electrodeposited on the surfaces of the board is exposed uniformly to the light source positioned farther away from the workpiece surface.

BRIEF DESCRIPTION OF THE DRAWINGS

The above and other objects, features and advantages of the present invention will become more apparent from the following description of the preferred embodiment thereof, taken in conjunction with the accompanying drawings, in which like reference numerals denote like members and of which:

FIG. 6A is a plan view of a light source when positioned adjacent to a workpiece;

FIG. 6B is a plan view of a light source when positioned farther away from the workpiece;

FIG. 7A is a side view drawing of FIG. 6A; and

FIG. 7B is a side view drawing of FIG. 6B.

DETAILED DESCRIPTION OF THE PREFERRED EMBODIMENT

Figure 1:
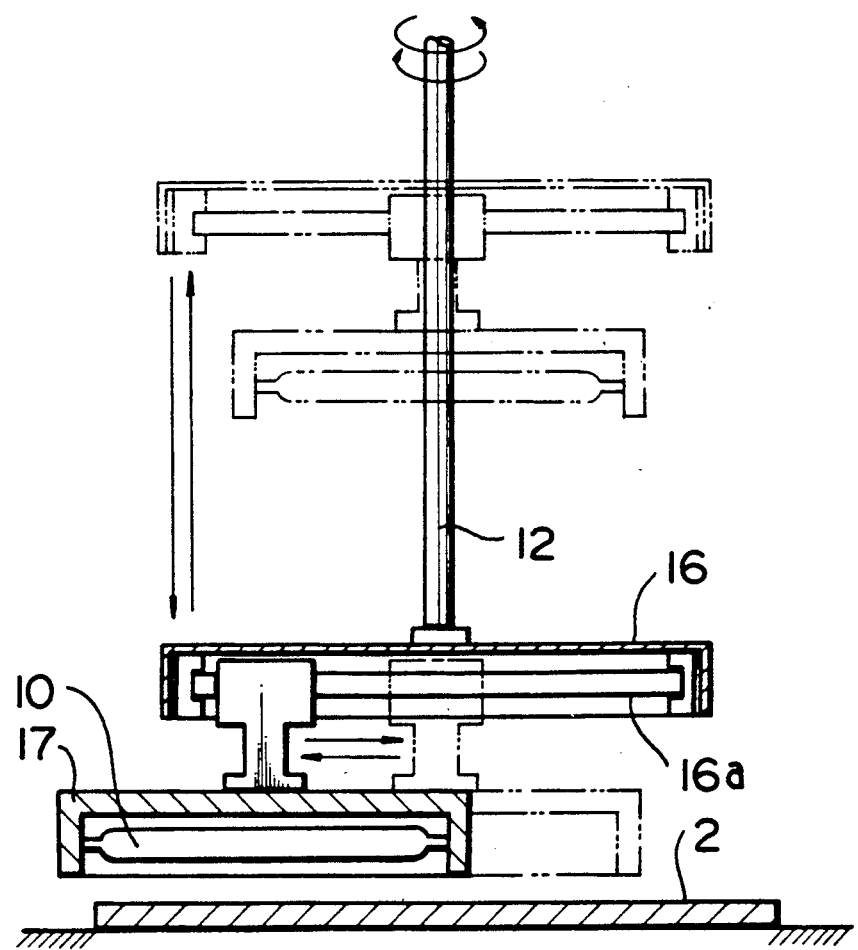
FIG. 1 is a partial sectional front view of an exposure apparatus, which is employed to explain one embodiment of the photoresist exposure method and apparatus therefor according to the present invention.
Figure 2:
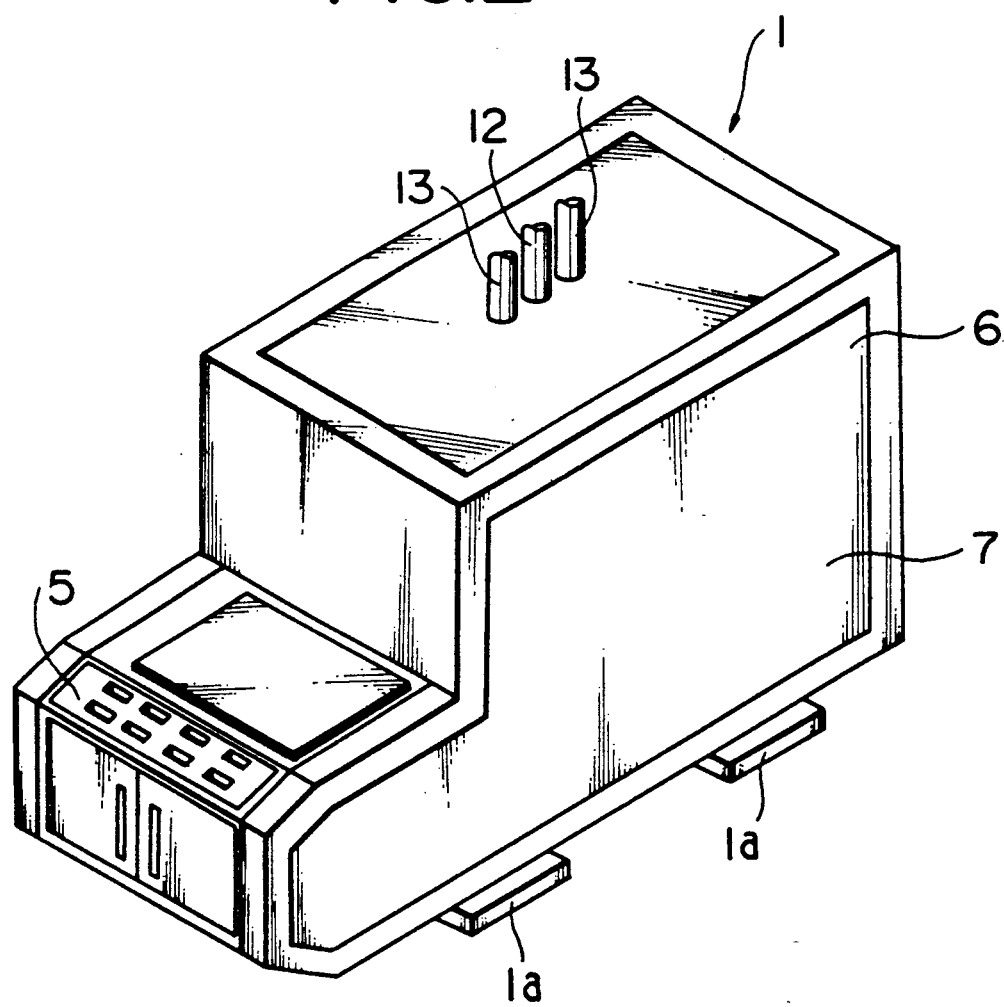
FIG. 2 is a overall perspective view of an exposure apparatus according to the present invention.

One embodiment of the present invention will be described below in detail with reference to the accompanying drawings. In FIG. 1 and FIG. 2, numeral 1 denotes an exposure apparatus, numeral 1a denotes a leg adapted to place the apparatus horizontally, numeral 5 denotes a control box, numeral 6 denotes an electrical switch board, numeral 7 denotes a cooling unit. Numeral 2 denotes a workpiece which has been electrodeposited on its surface and on the inner walls of its through-holes, and which has been placed at a predetermined position. Numeral 3 (FIG. 3) denotes a light source adapted to face the workpiece 2 and comprises a mercury lamp 10 which irradiates ultraviolet rays, and a lamp housing 17. The lamp housing 17 is adapted to be lifted and rotated.

Figure 3:
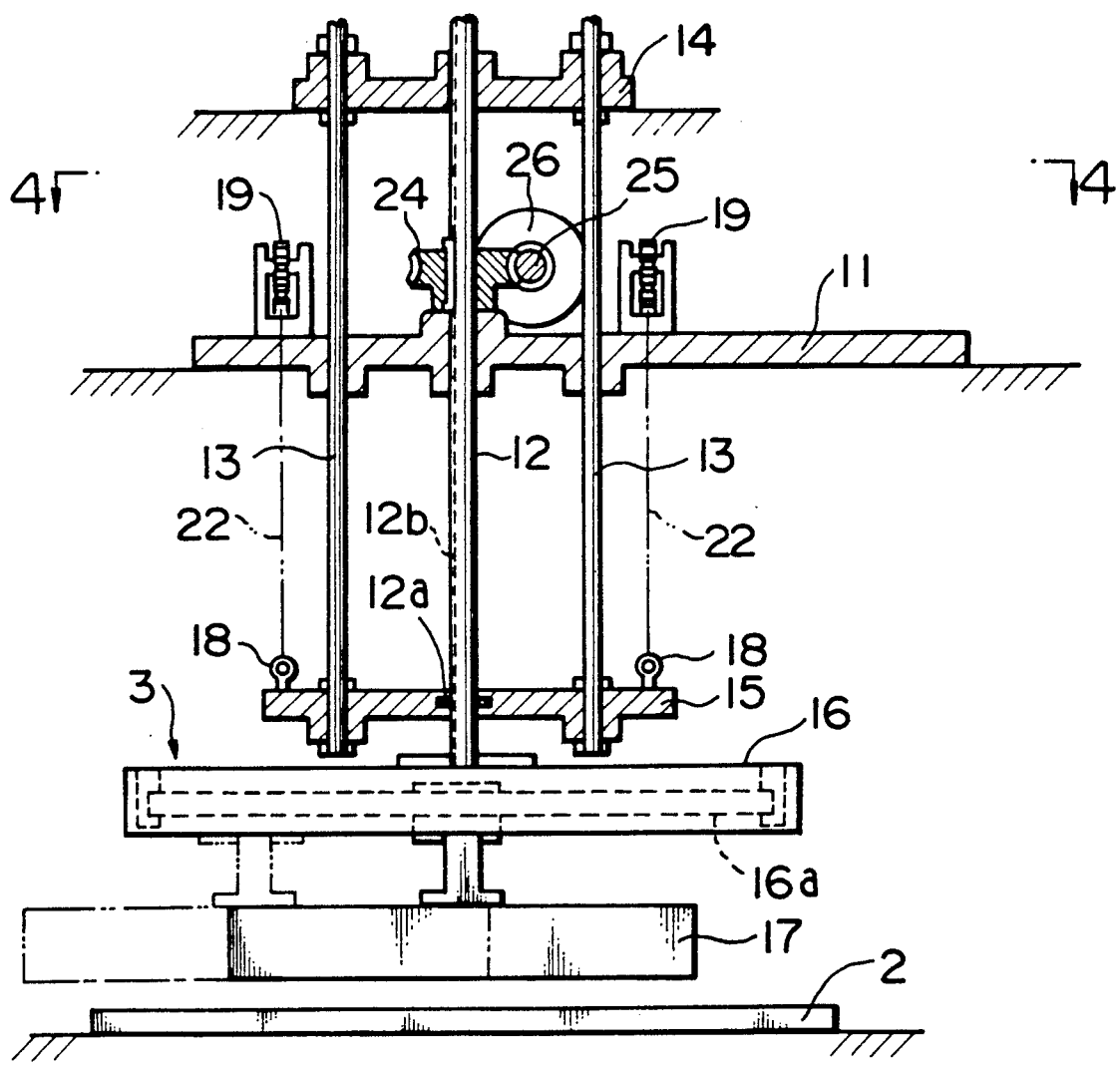
FIG. 3 is an another partially sectioned front view of an exposure apparatus, which is employed to explain how the light source is rotated and lifted.
Figure 4:
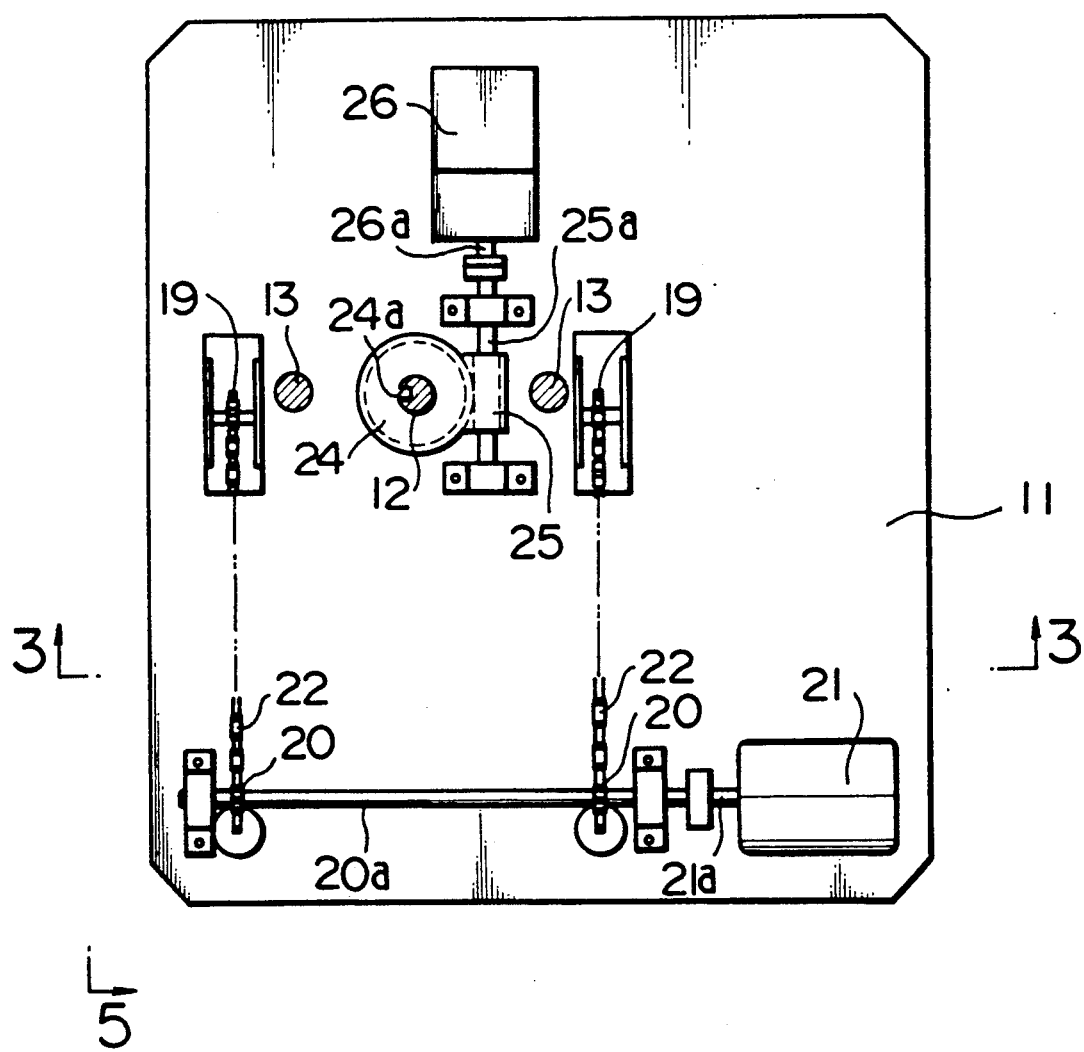
FIG. 4 is a sectional drawing viewed along arrow 4—4 in FIG. 3.
Figure 5:
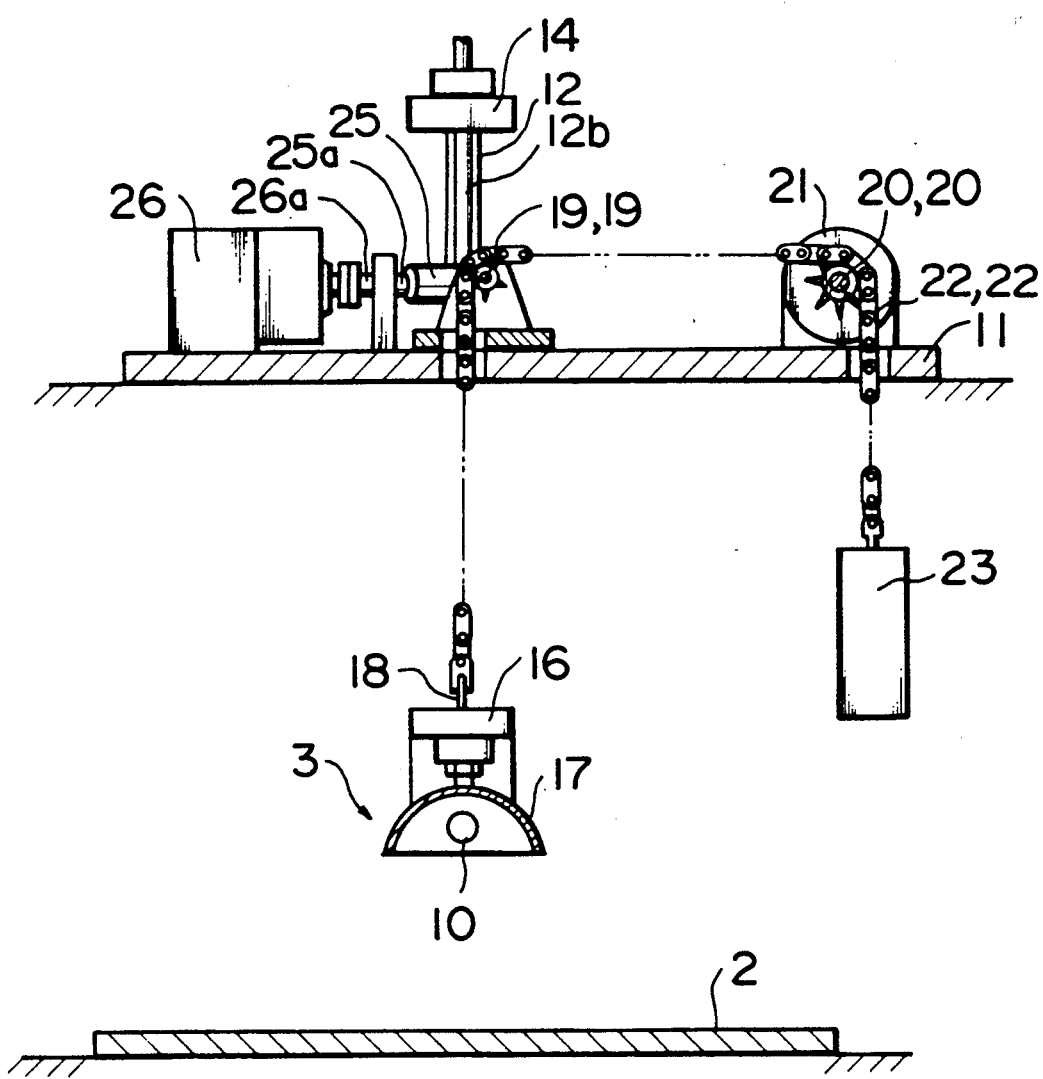
FIG. 5 is a sectional drawing viewed along arrow 5—5 in FIG. 4.

FIG. 3 to FIG. 5 illustrate the mechanisms used to lift and rotate light source 3. A base plate 11 provides a hole for slidably inserting a rotational shaft 12, and holes for slidably inserting suspension bars 13. The upper portions of suspension bars 13 slidably penetrate through a bracket 14 and the lower portions of suspending bars 13 are fixed to suspension base 15. The rotational drive shaft 12 penetrates the base plate at the middle point between the two suspension bars 13. A disc 12a (FIG. 3) projects from the rotational shaft 12 into a gap in and engages with suspension base 15 in such a manner as to be able to rotate, without causing rotation of suspension base 15, and to lift suspension base 15 along its axial line, when rotational shaft 12 is lifted. A frame 16 is fixed to a lower end of the rotational drive shaft 12. The frame 16 provides a guide shaft 16a on which the mercury lamp 10 (FIG. 1) is slidably mounted, so that the mercury lamp 10 can slide horizontally. A hook 18 is provided at both ends of the suspension base 15. A gear 19 is rotatably mounted on both ends of the base plate 11 such that the position of each gear 19 corresponds to each hook 18 perpendicularly, and a chain 22 is perpendicularly connectable with both gear 19 and hook 18. Gears 20 are mounted on the base plate 11 (FIG. 4) and they are positioned to align with gears 19 such that each chain 22 is engageable with gears 19, 20. Gears 20 are fixed to a drive shaft 20a which is coupled with the motor shaft 21a of a drive motor 21.

Accordingly, chains 22 connected to the hooks 18 engage with the gears 19 and the gears 20 and provide balance weights 23 (FIG. 5) at their distal ends. As shown in FIG. 5, when the drive motor 21 rotates, the chain 22 engaged with both gear 19, 20 lifts or lowers the suspension base 15, and the lamp housing 17 connected to the end of the rotational drive shaft 12 is also lifted or lowered accordingly. A worm wheel 24 is slidably inserted onto the rotational drive shaft 12 and is horizontally placed on the surface of base plate 11 such that the worm wheel 24 meshes with a worm gear 25 coupled to a motor shaft 26a of a gear motor 26. The rotational drive shaft 12 provides a groove 12b (FIG. 3) along its, axis line throughout. A 24a projected from the inner wall of the worm wheel 24 engages loosely into the groove 12b such that when the gear motor 26 rotates, the rotational drive shaft 12 rotates and also the lamp housing 17 rotates, and when the rotational shaft 12 is to be lifted, the rotational shaft 12 slides up through the worm wheel 24.

With the aforementioned construction of the photoresist exposure apparatus, when the first exposure for the inner wall of the through-holes is to take place, the mercury lamp 10 is placed aside as shown in FIG. 6A, being moved along the guide shaft 16a, and the mercury lamp 10 is lowered employing the lifting and lowering means which comprises the drive motor 21, the gear 19 the gear 20, the chain 22 and the suspension base 15.

Then, employing the rotating means which comprises the worm gear motor 26, the worm gear 25, the worm wheel 24, the rotational drive shaft 12, and the frame 16, the mercury lamp 10 is rotated horizontally along the surface of the workpiece 2 as shown in FIG. 7A, employing the negative film 4 for through-holes with higher intensity of light.

The reason why rotation of the lamp is necessary in this case is because the depth of the through-hole is rather deep when compared with the planar dimensions, so, variation of the incident angle of light into the through-holes is necessary. The mercury lamp 10 is rotated in both clockwise and counter-clockwise directions as shown in FIG. 6A, such that the inner wall of the through-holes is uniformly irradiated. Thus, the photoresist coated on the inner wall surface of the through-hole is hardened.

When the secondary exposure for the photoresist coated on the surface of the workpiece 2 works, the mercury lamp 17 is placed to the central portion as shown in FIG. 6B, and then the mercury lamp 17 is lifted employing the means for lifting and lowering, and further the negative film 4 is changed to the negative film 4' for forming the precise circuit pattern. Finally, the workpiece 2 is irradiated with the light such that the photoresist coated on the surface of the workpiece is exposed and hardened.

On this secondary exposing work, the rotation of the mercury lamp 17 is not necessary because if it is rotated, the incident angle of light for the workpiece becomes aslant, so delicate lines and precise circuit pattern can not be precisely printed. According to this embodiment, the ultraviolet light irradiates directly for the workpiece, but it is possible to irradiate indirectly providing a reflecting mirror in the apparatus and to provide multi mercury lamps in lieu of a single mercury lamp.

It is also possible to provide two light sources, i.e., upper source and lower source, so that placing a base in between these two sources and disposing workpieces on front side and back side of the base, the exposure work is effectively conducted.

According to the present invention, when the first exposure for the inner wall surface of the through-holes wherein the photoresist is electrodeposited works, the light source is placed adjacent to the workpiece and is rotated such that the ultraviolet light irradiates to the workpiece through the negative film, and when the second exposure for the surface of the workpiece wherein the photoresist is electrodisposed works, the ultraviolet light irradiates from the separated position to the workpiece though the negative film for forming a precise circuit pattern.

Accordingly, the photoresist on the inner wall surface of the through-hole is exposed with the light positioned adjacent to the workpiece and its incident angle varies such that the inner wall surface of the through-hole is uniformly exposed, and additionally, the intensity of light is so strong that the incomplete hardening of the photoresist is avoided.

On the other hand, the photoresist on the surface of the workpiece is exposed with the light positioned separated from the workpiece such that over exposure damage and the thermal expansion of the film, and destruction of the photoresist due to higher temperatures are avoided. As aforementioned, according to the present invention, the exposure for the through-holes and for the surface of the workpiece are conducted by a single light source, while the conventional method needs multiple light sources for each exposure work individually. Thus, with the present invention it is possible to realize an efficient exposure process.

Although the present invention has been described through specific terms, it should be noted that the described embodiment is not necessarily exclusive and that various modifications may be imparted thereto without departing from the invention which is limited solely by the appended claims.

What is claimed is:

1. A photoresist exposure method in which a photoresist that is coated by electrodeposition on the surface of a board for printed wiring having been subject to through-hole plating and on the inner wall surfaces of through-holes therein is exposed through a negative film with precise circuit pattern to ultraviolet light comprising the steps of:
    irradiating the photoresist coating on the inner wall surface of the through-holes through the negative film with the ultraviolet light from a light source positioned adjacent to the workpiece while the light source is rotated along the surface of the workpiece; and
    irradiating the photoresist coating on the surface of the board through the film to form a precise circuit pattern with the ultraviolet light from a light source positioned separated from the workpiece.

* * * * *